(12) United States Patent
Calvert

(10) Patent No.: US 12,153,107 B2
(45) Date of Patent: Nov. 26, 2024

(54) COIL SUPPORT

(71) Applicant: Siemens Healthcare Limited, Camberley (GB)

(72) Inventor: Simon James Calvert, Chipping Norton (GB)

(73) Assignee: Siemens Healthcare Limited, Camberley (GB)

( * ) Notice: Subject to any disclaimer, the term of this patent is extended or adjusted under 35 U.S.C. 154(b) by 300 days.

(21) Appl. No.: 17/763,715

(22) PCT Filed: Jul. 16, 2020

(86) PCT No.: PCT/EP2020/070141
§ 371 (c)(1),
(2) Date: Mar. 25, 2022

(87) PCT Pub. No.: WO2021/058162
PCT Pub. Date: Apr. 1, 2021

(65) Prior Publication Data
US 2022/0326325 A1    Oct. 13, 2022

(30) Foreign Application Priority Data
Sep. 26, 2019 (GB) .................................. 1913853

(51) Int. Cl.
| | |
|---|---|
| *H01F 6/06* | (2006.01) |
| *G01R 33/38* | (2006.01) |
| *G01R 33/3815* | (2006.01) |
| *G01R 33/385* | (2006.01) |
| *G01R 33/421* | (2006.01) |

(52) U.S. Cl.
CPC ..... *G01R 33/3802* (2013.01); *G01R 33/3804* (2013.01); *G01R 33/3815* (2013.01); *G01R 33/3858* (2013.01); *G01R 33/421* (2013.01)

(58) Field of Classification Search
CPC ... H01F 6/06; G01R 33/3804; G01R 33/3815; G01R 33/421
See application file for complete search history.

(56) References Cited

U.S. PATENT DOCUMENTS

| | | | |
|---|---|---|---|
| 5,237,300 A | 8/1993 | Ige et al. | |
| 6,078,234 A * | 6/2000 | Huang ................... | B82Y 15/00 505/892 |
| 10,832,856 B2 | 11/2020 | Kagan et al. | |

(Continued)

FOREIGN PATENT DOCUMENTS

| | | |
|---|---|---|
| CN | 101512687 A | 8/2009 |
| CN | 106575559 A | 4/2017 |

(Continued)

OTHER PUBLICATIONS

Apr. 6, 2020—(GB) Search and Examination Report—1913853.6.
Nov. 2, 2020—(WO) International Search Report & Written Opinion—PCT/EP2020/070141.

*Primary Examiner* — Ramon M Barrera
(74) *Attorney, Agent, or Firm* — Banner & Witcoff Ltd.

(57) ABSTRACT

A superconducting magnet assembly may include a main magnet assembly having at least one annular coil arranged about an axis, and at least one shield coil, of greater diameter than the main magnet assembly, arranged about the axis. At least one support may be provided, attached to the shield coil and to the main magnet assembly.

23 Claims, 4 Drawing Sheets

(56) References Cited

U.S. PATENT DOCUMENTS

| | | |
|---|---|---|
| 2010/0265018 A1 | 10/2010 | Kruip et al. |
| 2010/0295640 A1 | 11/2010 | Tamura |
| 2011/0148416 A1 | 6/2011 | Jiang et al. |
| 2016/0189841 A1* | 6/2016 | Li .............................. H01F 6/04 62/437 |
| 2016/0314885 A1 | 10/2016 | Davis et al. |
| 2017/0299250 A1 | 10/2017 | Simpkins |

FOREIGN PATENT DOCUMENTS

| | | |
|---|---|---|
| CN | 208705464 U | 4/2019 |
| GB | 2569184 A | 6/2019 |
| WO | 2013/102509 A1 | 7/2013 |

\* cited by examiner

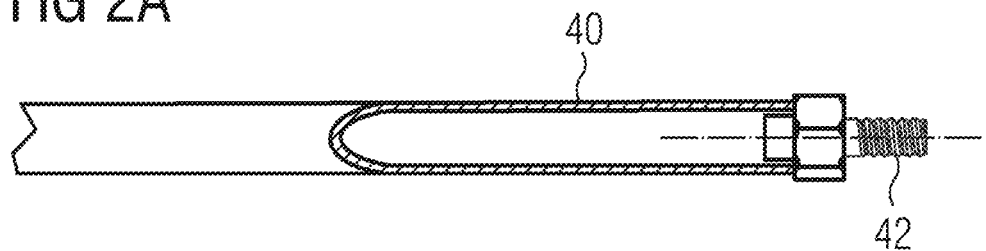
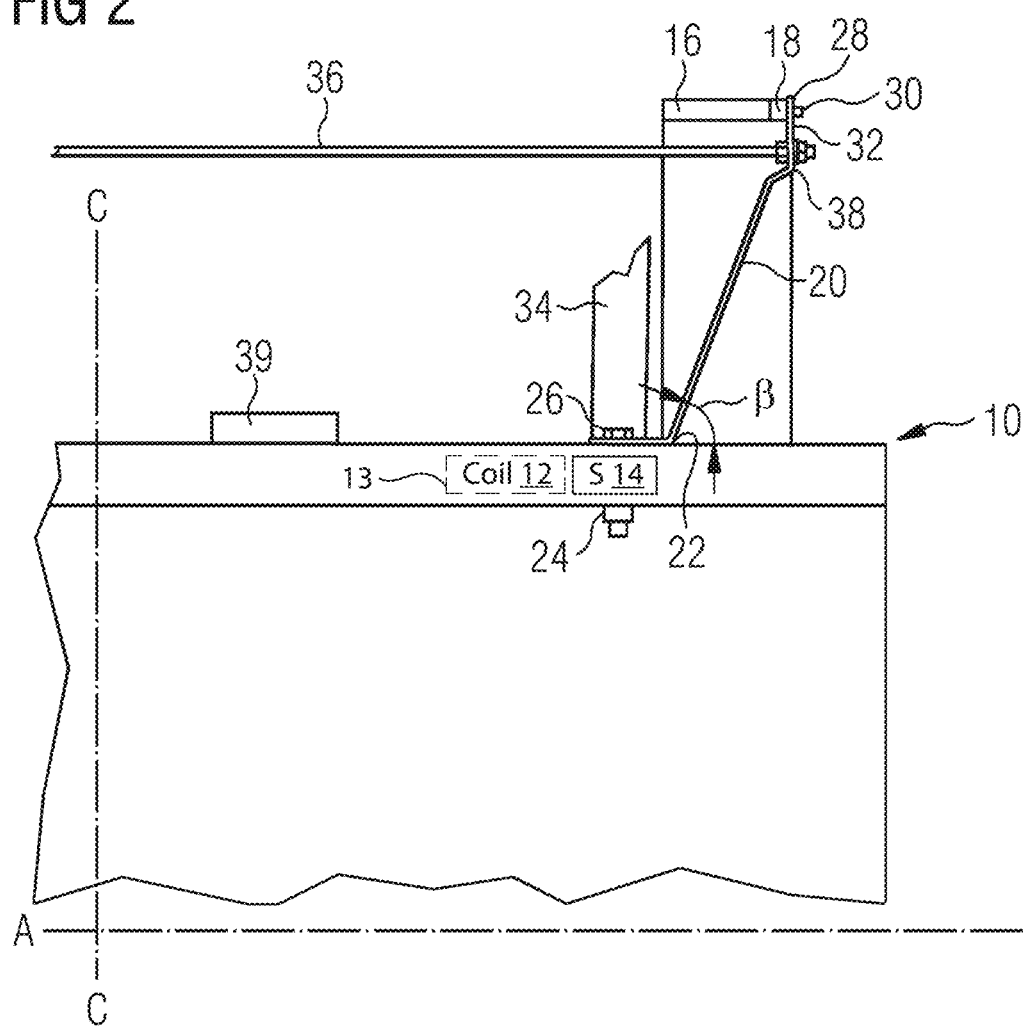

COIL SUPPORT

CROSS REFERENCE TO RELATED APPLICATIONS

This is a U.S. National Stage Patent Application of PCT/EP2020/070141, filed Jul. 16, 2020, which claims priority to Great Britain (GB) Patent Application No. 1913853.6, filed Sep. 26, 2019. Each of these applications is incorporated herein by reference in its entirety.

BACKGROUND

Field

The present disclosure relates to superconducting magnets, and in particular to superconducting magnets for use in Magnetic Resonance Imaging (MRI) systems and Nuclear Magnetic Resonance (NMR) systems.

Related Art

Typically, such superconducting magnets incorporate active shielding to reduce stray magnetic field. Active shielding comprises counter-running coils positioned outside of the main magnet coils. For an efficient design, there should be a substantial radial gap between the shielding coils and the inner magnet. In operation, the shield coils typically experience axial body forces of many tonnes, and must be accurately positioned. It may be problematic to support these shield coils in an efficient and cost-effective manner.

The present disclosure addresses this issue and aims to provide arrangements to support these shield coils in an efficient and cost-effective manner.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 schematically shows a conventional arrangement of a shield coil support structure.

FIG. 2 schematically shows an arrangement of a shield coil support structure according to an embodiment of the present disclosure.

FIG. 2A shows a detail of an alternative feature of an exemplary embodiment of the disclosure.

Figure 4:
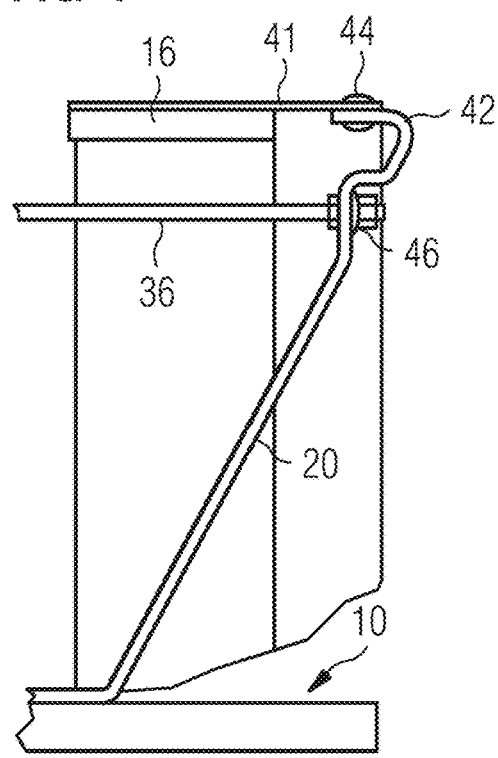

FIG. 4 schematically shows an arrangement of a shield coil support structure according to an exemplary embodiment of the present disclosure.

Figure 5:
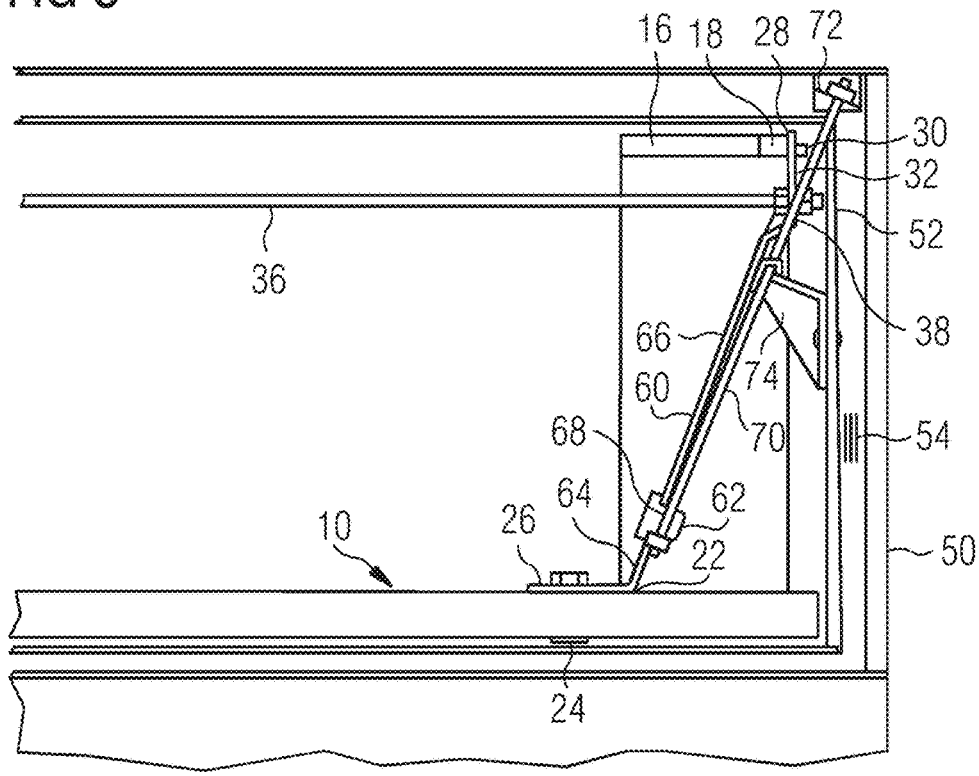

FIG. 5 shows another exemplary embodiment of the present disclosure, where a shield coil support arrangement is provided, and arrangements are shown for supporting the whole cold-mass within an outer vacuum chamber (OVC).

Figure 6:
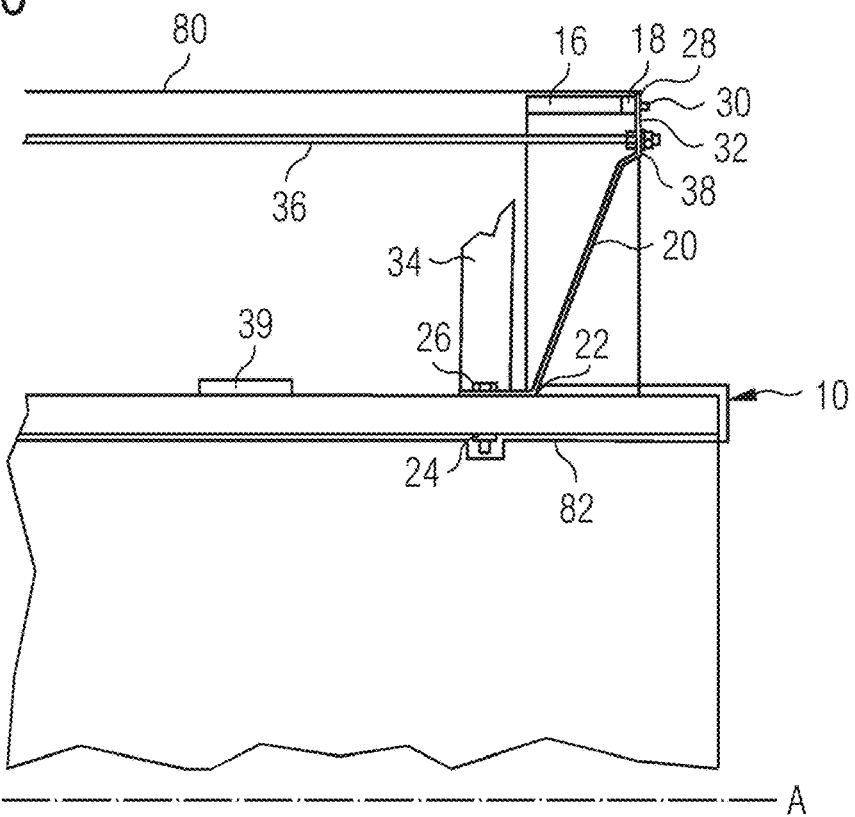

FIG. 6 shows another exemplary embodiment of the present disclosure, in which conical supports are employed as part of a thermal radiation shield.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, and components have not been described in detail to avoid unnecessarily obscuring embodiments of the disclosure.

Figure 1:
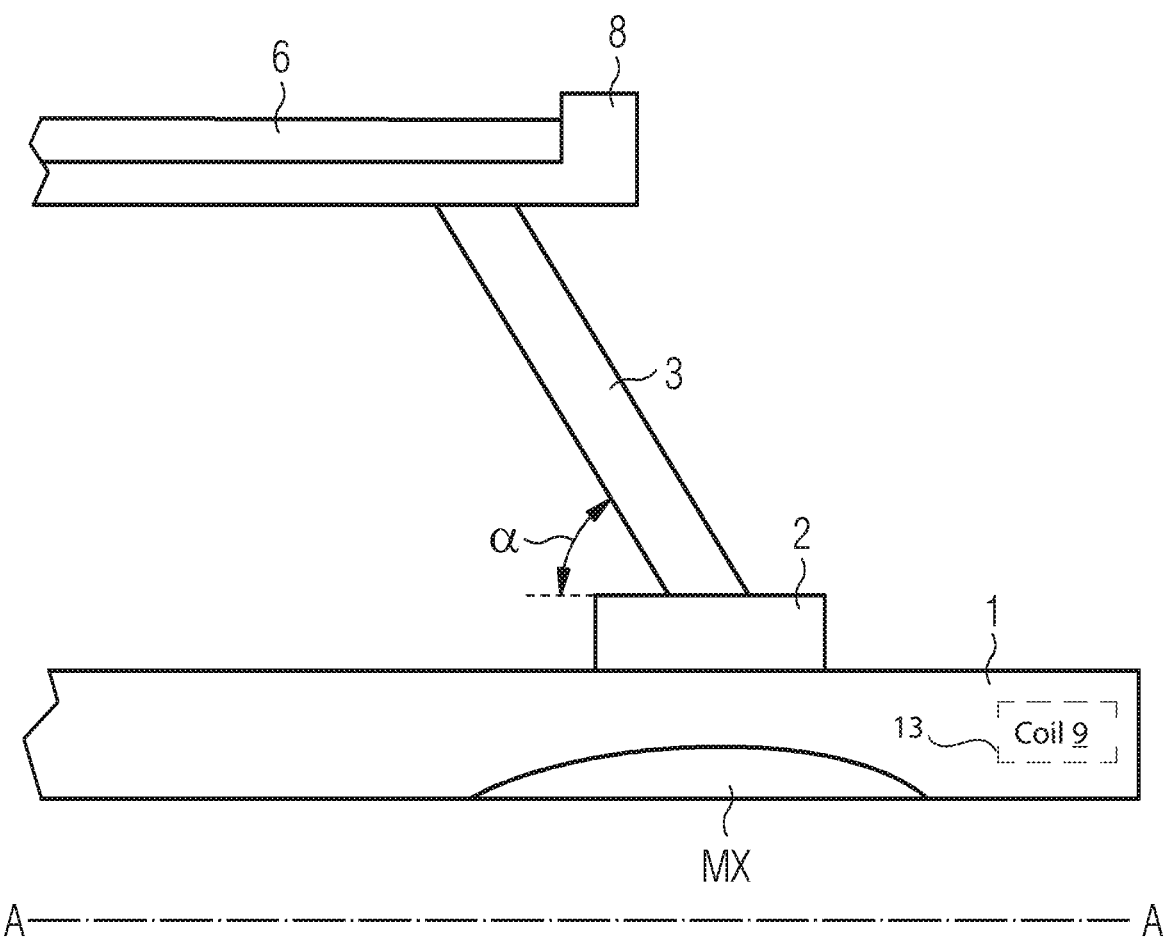

FIG. 1 shows a conventional superconducting magnet for use in an MRI system, as described in WO2013/102509. Self-supporting main magnet assembly 1 may comprise at least one annular superconducting main coil 9. A number of shield coils 6 of greater diameter than the main coils are provided, placed coaxially with the main coils about axis A-A (schematically represented). Intermediate coil support structures 3 are affixed to the self-supporting main magnet assembly 1 and to journals 8 retaining the shield coils 6, which may be impregnated in epoxy resin 13, to retain the main and shield coils in their correct respective positions.

Former-less structures 1 are particularly suited to very lightweight magnet structures such as those required for cryogen-free magnets requiring fast cooldown times. Other conventional arrangements become impractical with very thin coils. It may become impractical to suspend the "cold-mass"; being the self-supporting main magnet assembly 1 as shown in FIG. 1, directly from the vacuum vessel as an unacceptable level of deformation of the magnet assembly may result.

The above problem, including the solution proposed by WO2013/102509, becomes difficult to solve when it is required to keep the "cold-mass" low, that is to say, the mass of the equipment which is held at the operating temperature of the superconducting magnet, which is typically lower than 20K, commonly about 4K. Recent developments include conduction-cooled magnets, which are not provided with a bath of liquid cryogen. To minimise the cooldown time for such structures, the coils and their formers, where provided, tend to become quite thin, and have reduced inherent stiffness due to the drive to reduce mass. Despite this, it is required to allow the suspension of the cold-mass within the cryostat without excessive distortion, and it becomes difficult to provide arrangements for supporting the shield coils from the main magnet assembly.

Former-less all-bonded solutions, where coils are bonded to sides of annular spacers of similar radial extent, may be employed for very light structures such as those required for cryogen-free magnets with fast cool-down times. The known coil support solutions become increasingly difficult, or impossible, to implement as the coils get thinner. The cold-mass may need to be stiffened significantly to allow the magnet suspension to be connected directly to the cold-mass. A lightweight and stiff structure is required which supports the shield coils around their entire circumference without subjecting any coils to concentrated mechanical loading, which might otherwise cause deformation of the coils.

The present disclosure aims to provide thin, lightweight supports for mounting thin, lightweight shield coils onto a thin, lightweight main magnet assembly. The supports of the present disclosure add relatively little mass to the cold-mass, which maintains efficiency of cooling for conduction-cooled magnets. The resulting cold-mass structure has a high inherent stiffness when completely assembled, minimising distortion of the coils when suspended, along with minimising thermal and electromagnetic loading.

In use, each superconducting magnet coil is subjected to electromagnetic loading comprising radial and axial forces due to the interaction of the magnetic field generated by the superconducting coil with the magnetic field generated by the superconducting magnet as a whole. Each superconducting coil experiences an axial body force which is typically outwards away from the mid-plane, but may be inwards towards the mid-plane, depending on magnet design, and is also subjected to a substantial radial force which is typically in an outwards radial direction but can also be radially inwards in some cases, depending on magnet design. For thin coils, this combination of forces due to the electromagnetic loading can cause the superconducting coil to buckle if supported at only a few points and, at least, can cause local deformation which gives rise to high local stresses and poor uniformity in the generated magnetic field. Conventionally, such stress concentrations have been addressed by making the superconducting coil structure heavier and more expensive. The present disclosure provides continuous support around the circumference of a superconducting coil such that stress concentrations are virtually eliminated, distortion is minimised and buckling modes are avoided. In turn, this minimises any resultant degradation of magnetic field uniformity.

The present disclosure seeks to provide a light and stiff structure which supports the shield coils around their entire circumference, without subjecting any coils to concentrated mechanical loading.

FIG. 2 shows a partial cross-section of an embodiment of the present disclosure, which essentially has rotational symmetry about axis A-A and reflective symmetry about centre plane C-C.

Figure 3:
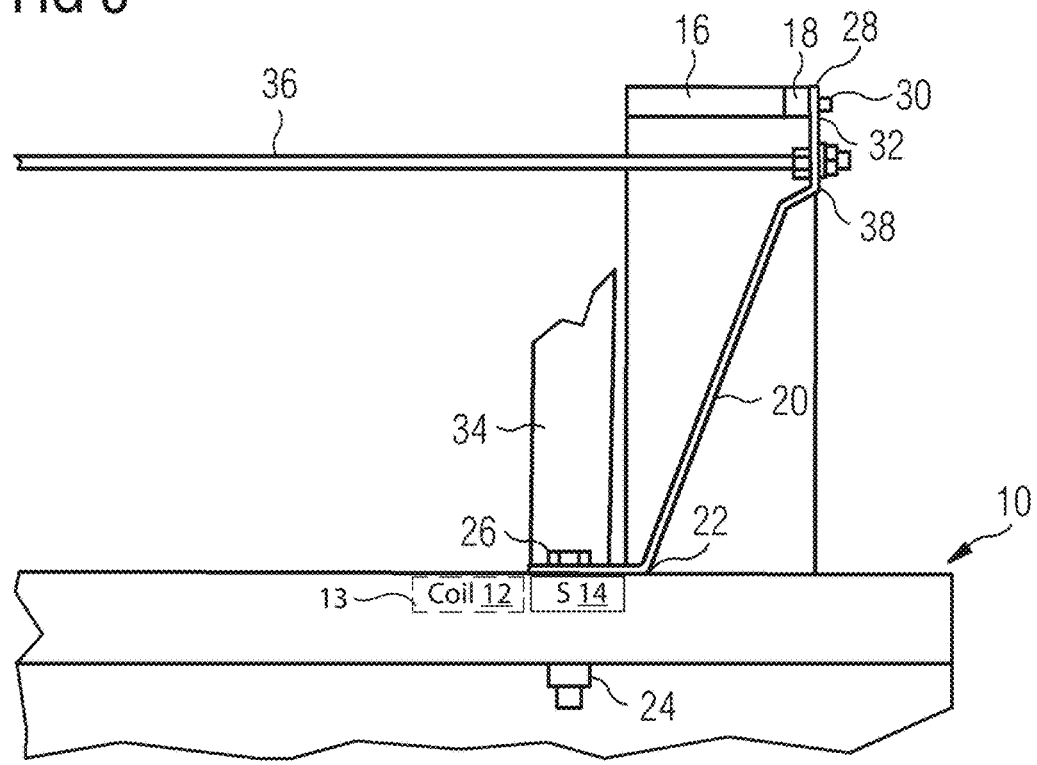
FIG. 3 shows an enlargement of certain features of FIG. 2.

As illustrated by the example embodiment schematically represented in FIG. 2, the disclosure provides one or more conical annular supports 20 to connect a thin and flexible inner magnet ("main magnet assembly") 10 to thin shield coils 16. While all of these components are flexible and relatively mechanically weak prior to assembly, when connected together, a very stiff and extremely light structure is formed. FIG. 3 shows a magnified view of certain features of FIG. 2.

In FIG. 2, a main magnet assembly 10, not illustrated in detail, comprises at least one superconducting coil 12, which may be impregnated in resin 13. Shield coils 16 are provided, of greater diameter than the main magnet assembly 10. In the illustrated embodiment, an end-ring 18 is provided, bonded to the axially outer end of each respective shield coil 16. This may be of a resin-impregnated fibre material.

According to a feature of the present disclosure, a conical annular support 20 is provided. A radially inner circumference 22 of this conical annular support 20 is attached to the main magnet assembly 10. In the illustrated example, this is achieved by bolts 24 through an inner flange 26 in the material of the conical annular support 20, and directed axially inwards from the radially inner circumference 22 of the annular support 20 either into a tapped hole in the material of the spacer 14, or into a threaded insert itself retained within the material of the spacer 14. A radially outer circumference 28 of the conical annular support 20 is attached to one of the shield coils 16. In the illustrated embodiment, this is achieved by bolts 30 directed axially through a peripheral radially-extending outer flange 32 in the material of the conical annular support 20, either into a tapped hole in the material of the end-ring 18, or into a threaded insert itself retained within the material of the end-ring 18.

In an exemplary embodiment, a similar arrangement is provided at the other axial extremity of the main magnet assembly 10, providing support to the axially outer extremity of the other shield coil.

In an exemplary embodiment, the or each conical annular support 20 is formed from a thin metal sheet, for example 1 mm thick stainless steel, aluminium or aluminium alloy, although each conical annular support 20 could be made of other material such as composite materials such as Carbon-fiber-reinforced polymers (CFRP) or Glass Reinforced Plastic (GRP).

In some embodiments, such as illustrated in FIG. 2, one or more suspension element, such as a pillar leg supports 34, may be attached to the main magnet assembly 10. As illustrated, and conveniently, the pillar leg support 34 may be attached to the main magnet assembly 10 by one or more of the bolts 24 which attach the conical annular support 20 to the main magnet assembly 10. The other end of the pillar leg support 34 may be attached to an inner surface of an Outer Vacuum Container (OVC) (not illustrated in FIG. 2) which defines a vacuum region around the magnet structure. In such a manner, the weight of the main magnet assembly 10 may be borne by the OVC through tension in the pillar leg supports 34. The weight of the shield coils 16 may be borne by the OVC through tension in the pillar leg supports 34 and tension and compression in the conical annular supports 20.

In use, shield coils 16 are subjected to axially outward forces of many tonnes, which may be sufficient to deform the or each conical annular support 20. In the view shown in FIG. 2, this deformation would appear in that the shield coil 16 rotates to some extent about the radially inner circumference 22 of the annular support 20 with deformation of the material of the conical annular support 20. This in turn would mean that the radially-extending outer flange 32 is no longer radially-directed, and may lead to deformation of the shape of the shield coil(s) 16. To resist such deformation, in certain embodiments of the present disclosure, axial rods 36 may be provided, extending between shield coil support structures at opposite ends of the magnet structure. For example, eight such rods may be provided, distributed circumferentially around the magnet structure. The axial rods 36 provide additional stiffness in the axial direction and thus prevent excessive distortion of the conical annular support 20. This additional stiffness provided by the axial rods 36 may allow a thinner material to be used to form the conical annular support 20. In exemplary embodiments, a conical annular support 20 is provided near each axial extremity of the main magnet assembly 10, and the axial rods 36 extend between the two conical annular supports 20. In the embodiment illustrated in FIG. 2, flattened regions 38 are provided at circumferential intervals near to the outer flange 32, and respective axial rods 36 are mounted to respective flattened regions 38 by bolting, or by attaching nuts to a threaded part of the axial rod 36 itself.

In the embodiment of FIG. 2, each axial rod 36 is of a solid material, such as stainless steel. End regions, at least, of each axial rod are threaded and located through corresponding holes in respective conical annular supports 20. Nuts are threaded onto the threaded regions either side of the conical annular support 20 and washers may be placed between each nut and the associated conical annular support 20.

In an alternative arrangement, illustrated in FIG. 2A, the axial rod 40 is a hollow rod, with a threaded bolt 42 or similar mounted in each end, to enable it to be mounted to conical annular supports 20 in the manner of the axial rod 36 of FIG. 2.

The presence of such axial rods prevents, or at least limits, deformation of the conical annular supports 20 and so reduces the tendency of the shield coils 16 to deform or change position under electromagnetic loading.

The conical annular supports 20 are attached to the main magnet assembly 10 at least at intervals around the circumference of the main magnet assembly, for example by bolts 24. In some embodiments, the conical annular supports 20 may be continuously attached to the main magnet assembly 10, for example by a resin-impregnated glass band which overlaps the inner flange 26 and the main magnet assembly 10. In alternative embodiments, the conical annular supports 20 are bonded to the main magnet assembly 10 or are clamped to the main magnet assembly 10 by a mechanical compression band. Discreet fixings such as the bolts 24 illustrated in the drawing simplify manufacture, but in embodiments where the conical annular supports 20 are of a resin-impregnated composite material, a bonded joint may be found advantageous.

In the radial direction, the conical annular supports 20 provide rigid support and retain the annular shape of the main magnet assembly 10. This is required to enable adequate uniformity of the magnetic field.

The conical annular supports 20 are attached to the shield coils 16 at least at intervals around the circumference of the main magnet assembly, for example by bolts 30. In some embodiments, the conical annular supports 20 may be continuously attached to the main magnet assembly 10, for example by a resin-impregnated glass band which overlaps the inner flange 26 and the main magnet assembly. In the radial direction, the conical annular supports 20 provide rigid support and retain the annular shape of the shield coils 16. This ensures that the shield coils remain accurately positioned with respect to each other and with respect to the main magnet assembly 10. By supporting the shield coils around their entire circumference, out-of-plane bending of the shield coils and stress concentrations may be avoided, although both of these occur with conventional approaches which use discrete tension elements to support shield coils.

The conical annular supports 20 provide axial and radial stiffness to resist mechanical, thermal and electromagnetic loads.

The conical annular supports 20 may also provide mounting locations for a tensile suspension system, discussed below with reference to FIG. 5, or a tension or compression suspension system such as using pillar supports 34 mounted to the inner flanges 22 of the conical annular supports 20 as discussed above with reference to FIG. 2. The pillar supports 34 may attach to the conical annular supports 20, as illustrated in FIGS. 2 and 3, but may alternatively be mounted to the main magnet assembly 10, such as near to a conical annular support 20. The conical annular supports 20 retain the main magnet assembly 10 round, and thereby assist in preventing the pillar support from distorting the inner magnet.

The constraint of the main magnet assembly 10 and shield coils 16 provided by the conical annular supports 20 may be balanced against requirements for axial stiffness, by appropriately selecting parameters of the conical annular supports 20, such as the cone material, thickness and rake angle β. Further tuning of the mechanical properties of the structure may be achieved by adjusting the stiffness, number and position of axial rods 36; 40, where provided.

In certain embodiments of the disclosure, the conical annular supports 20 may be made of a material of relatively high thermal conductivity, such as copper or aluminium. This will provide a high-conductivity thermal path between the main magnet assembly 10 and the shield coils 16. This will assist with thermal uniformity, particularly in conduction-cooled magnets.

Conventionally, a termination area is provided on a main magnet assembly 10 such as shown at 39 in FIG. 2. There, ends of superconducting wires making up the main magnet coils and the shield coils are brought together, and electrical connections made to a superconducting persistent switch, also known as a magnet switch, and to a power supply, a run-down load and so on. Conveniently, such termination area may be provided on a radially outer surface of the main magnet assembly 10. The conical annular supports 20 of the present disclosure allow such region to be particularly accessible. The accessibility of such regions is improved yet further in case tension rods 36, 40 are omitted, for example, in embodiments where the conical annular supports 20 themselves provide sufficient stiffness to locate and retain the shield coils.

The conical annular supports 20 can be cost effectively manufactured by fabrication, spinning or pressing of sheet metal or by composite lay-up. The support structure provided by the present disclosure has a much lower part count and complexity compared to conventional support structures for shield coils, and magnet structure supports.

FIG. 4 shows detail of an alternative embodiment of the disclosure, in which shield coils 16 are not provided with an end ring (18, FIG. 2). Instead, an overbinding 41 of a composite material such as resin-impregnated glass fibre, or resin-impregnated carbon fibre is provided, at least partially over the radially outer surface of each shield coil 16. The overbinding 41 protrudes axially beyond the axially outer end of the respective shield coil 16. In the illustrated embodiment, the conical annular support 20 has a radially outer extremity turned axially towards the axial centre of the magnet, to form an outer axially-directed flange 42. The overbinding 41 is attached to the outer axially-directed flange 42, in the illustrated embodiment by fasteners such as rivets 44. Such fasteners may be provided at intervals around the circumference of the shield coil 16. The number of fasteners, and hence their spacing, should be determined in order to ensure that the shield coil 16 does not deform appreciably during normal use. That determination should also consider the mechanical strength of the overbinding 41, which will provide annular support to the shield coil.

Similar to the embodiment of FIG. 2, axial rods 36 or 40 may be attached to respective flattened regions 46 provided near to the outer flange 42. In either embodiment, the flattened region may be provided axially inboard or outboard of the cone of the conical annular support 20. In some embodiments, due to the use of a relatively thin material for the conical annular support 20, flattened regions 46 for attachment of axial rods 36 or 40 are provided with reinforcement such as plates of material, effectively locally increasing the thickness of the material of the conical annular support 20, or pressed-in or spun-in features in the material of the conical annular support 20.

In other embodiments, not specifically illustrated, the orientation of the conical annular support 20 is reversed, that is to say that the conical annular support 20 reaches the axially inner edges of the shield coils and slopes axially outwards towards the surface of the main magnet assembly 10. In further embodiments, not specifically illustrated, each shield coil 16 may be provided on the opposite axial side of the conical annular support 20 to that proposed hitherto. Conical annular support 20 may be replaced with annular supports of other shapes, in order to improve desired structural properties.

FIG. 5 illustrates a further embodiment of the present disclosure. In this embodiment, the conical annular support 20 is adapted to support the weight of the main magnet assembly 10 by support rods 70 braced against outer vacuum container (OVC) 50. In an exemplary embodiment, the support rods 70 preferably also support the weight of a thermal radiation shield 52. OVC 50 provides an evacuated volume which encompasses the superconducting magnet. The thermal radiation shield 52 (at about 50K) must of course be retained and mechanically supported in a manner which ensures that it is thermally insulated both from the OVC (at about 300K) and the superconducting magnet (at about 4K).

Thermal radiation shield 52 is located between the superconducting magnet and the OVC. It prevents thermal radiation from the interior surface of the OVC—typically at about 300K—from reaching the superconducting magnet—typically at about 4K. The thermal radiation shield 52 is typically cooled to a temperature of about 50K. Cryogenic refrigerators typically provide much greater cooling power at 50K than at 4K, so it is useful to remove any thermal influx at 50K rather than trying to remove it at 4K. Thermal radiation which reaches the superconducting magnet from the thermal radiation shield 52 has therefore only been emitted at 50K, and so carries much less energy than thermal radiation emitted at 300K, allowing the thermal influx which reaches the superconducting magnet from the thermal radiation shield 52 to be removed by the cryogenic refrigerator at 4K.

FIG. 5 illustrates an embodiment of the present disclosure which enables such retention and mechanical support. As is conventional in itself, multi-layer insulation (MLI) 54 may be provided in a space between the OVC and the thermal radiation shield. MLI typically comprises multiple layers of aluminised polyester sheet. It is illustrated intermittently for ease of representation, but in fact will essentially enclose the thermal radiation shield 52. Its purpose is to reflect thermal radiation from the OVC, and to establish a stable thermal gradient between the OVC and the thermal radiation shield.

The embodiment of FIG. 5 shares many features with other embodiments of the present disclosure, and those features carry identical reference numbers to the reference numbers carried in earlier drawings.

A number of rod bosses 62 are introduced into the conical annular support 60. For example, four such rod bosses may be provided distributed circumferentially around each conical annular support 60. In an exemplary embodiment, each of the rod bosses is of a material such as resin-impregnated glass fibre or carbon fibre; stainless steel; or titanium and includes a through-hole 68 directed radially, inclined to the axis A-A to accommodate a corresponding support rod 70. Each rod boss 62 may be shaped, or otherwise arranged, to be retained in place mounted in the conical annular support 60.

In an exemplary embodiment, eight such bosses are provided, four on each of two conical annular supports 60, located at respective ends of the superconducting magnet assembly. In an exemplary embodiment, the rake angle β of each conical annular support corresponds to the orientation of the support rods 70 mounted to the rod bosses 62. Each of eight support rods 70, each mounted to a respective one of the rod bosses 62, is arranged at a compound angle between the OVC and the respective conical annular support 60 to provide mechanical support for the weight of the superconducting magnet structure, through the material of the conical annular support 60 to the OVC. By providing the tension rods 70 which follow the cone angle, torsion and bending of the material of the conical annular support 60 is minimised. Provision may thereby be made for support of the weight of the superconducting magnet without requiring a lengthening of the structure as a whole.

In the illustrated embodiment, both ends of support rod 70 are threaded. At the radially inner end of the support rod, the support rod 70 passes through the rod boss 62. At the radially outer end of the support rod, the support rod passes through a hole or notch in a mounting point 72 attached to the inner surface of the OVC, by welding or some similar permanent attachment. In an exemplary embodiment, both threaded ends of the support rod 70 are respectively fastened in place with a nut and also an optional washer. The support rods 70 are respectively brought into tension by tightening of the respective nuts, so as to restrain and support the superconducting magnet structure within the OVC.

A further feature of the embodiment of FIG. 5 is that the weight of thermal radiation shield 52 is borne by the support rods 70. To this end, a shield support 74 is mounted on the support rod 70. In an exemplary embodiment, at least one shield support 74 is mounted on at least one support rod. In an exemplary embodiment, at least one shield support 74 is mounted on each support rod 70. Each shield support 74 is attached to the respective support rod at an appropriate location, such that, in a stable thermal condition, the temperature of the support rod at the location of the shield support 74 would be approximately the same as the temperature of the thermal radiation shield, so that, in use, little thermal transfer occurs between the thermal radiation shield and the support rod 70. Shield support 74 is attached to the thermal radiation shield, so that the weight of the thermal radiation shield is at least partially borne by the shield support 74.

In certain embodiments of the present disclosure, such as that illustrated in FIG. 6 by way of example, the conical annular supports 20; 60 form parts of a "light-tight" thermal radiation shield. For example, an opaque, lightweight tube 80, such as of thin conductive metal such as aluminium or copper foil or a composite substrate covered in foil, may be provided between radially outer extremities of conical annular supports 20; 60 of any of the embodiments of the present disclosure, so as to form a radiation shield for the magnet cold mass comprising main magnet assembly 10 and shield coils 16. In this manner, conical annular supports 20; 60, lightweight tube 80 and main magnet assembly 10 form an isothermal volume in which termination parts 39 can be accommodated without additional thermal shielding. The main magnet assembly 10 may be brought within the isothermal volume by addition of a thermally conductive layer 80, for example of aluminium or copper foil, over surfaces of the main magnet assembly which are otherwise exposed outside of the isothermal volume.

The present disclosure accordingly provides a superconducting magnet assembly comprising a main magnet assembly 10 comprising at least one annular superconducting coil arranged about an axis A-A, and at least one shield coil 16, of greater diameter than the main magnet assembly 10, arranged about the axis A-A, wherein at least one annular support is provided, attached to the shield coil 16 and to the main magnet assembly 10.

In an exemplary embodiment, the annular support may be conical. In other embodiments, the support may be described as a thin conical section spanning a radial gap between inner (main) and outer (shield) coils.

Such an arrangement provides a lightweight and mechanically stiff shield coil support that is suitable for supporting very thin coils. The mechanical characteristics of the shield coil support can easily be tuned by changing the cone geometry, thickness and material. The support structure of the present disclosure is lightweight, and is suitable for cryogen-free or conduction-cooled magnets, since such magnets require fast cooling from room temperature on installation. The shield coil support 20; 60 of the disclosure also has low material content, and correspondingly low mass, allowing easier siting of the magnet, shorter cooldown time and reduced shipping costs. The annular shield coil support structure 20; 60 of the present disclosure is simple and cost effective. In exemplary embodiments, use of the conical support structure of the present disclosure allows access to the termination area of the magnet without obstruction.

The annular shield coil support structure of the present disclosure allows very lightweight magnet cold-masses to be mechanically suspended within a cryostat without excessive distortion, due to the mechanical rigidity imparted by the annular shield coil support.

In certain embodiments of the disclosure, the annular supports 20; 60 form parts of a thermal radiation shield around the cold-mass which also provides a light tight isothermal volume in which to mount the termination components and magnet switch.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

The invention claimed is:

1. A superconducting magnet assembly comprising:
a main magnet assembly including at least one annular coil arranged about an axis,
at least one shield coil, of greater diameter than the main magnet assembly, arranged about the axis, and
at least one conical annular support, attached to the shield coil and to the main magnet assembly, wherein the at least one conical annular support includes an end ring bonded to an axially outer end of the shield coil, a radially outer circumference of a material of the conical annular support being attached to the end ring.

2. The superconducting magnet assembly according to claim 1, wherein a radially outer flange is provided in the material of the annular support, the annular support being attached to the shield coil by the radially outer flange.

3. The superconducting magnet assembly according to claim 2, wherein the radially outer flange extends radially and is attached to the end ring.

4. The superconducting magnet assembly according to claim 1, wherein a radially inner circumference of the material of the annular support is attached to the main magnet assembly.

5. The superconducting magnet assembly according to claim 4, wherein an inner flange is provided in the material of the annular support, directed axially inwards from the radially inner circumference of the material of the annular support, the annular support being attached to the main magnet assembly by the inner flange.

6. The superconducting magnet assembly according to claim 4, wherein the main magnet assembly comprises resin-impregnated coils joined together by intermediate composite spacers, the radially inner circumference of the material of the annular support being attached to one of the composite spacers.

7. The superconducting magnet assembly according to claim 1, wherein the annular support is formed of a stainless steel sheet.

8. The superconducting magnet assembly according to claim 1, wherein the conical annular support is formed of composite material.

9. The superconducting magnet assembly according to claim 1, wherein the conical annular support is formed of a copper or aluminum sheet.

10. The superconducting magnet assembly according to claim 1, further comprising one or more suspension elements attached to the main magnet assembly and to an outer vacuum chamber, the one or more suspension elements being configured to bear a weight of the main magnet assembly, the shield coil, and the conical annular support.

11. The superconducting magnet assembly according to claim 10, wherein the one or more suspension elements comprises a pillar leg support.

12. The superconducting magnet assembly according to claim 11, wherein the pillar leg support is attached to the main magnet assembly by one or more bolts which attach the conical annular support to the main magnet assembly.

13. The superconducting magnet assembly according to claim 1, further comprising another conical annular support such that each axial extremity of the main magnet assembly includes a corresponding conical annular support, wherein axial rods extend between the conical annular support and the other conical annular support, at opposite ends of the main magnet assembly.

14. The superconducting magnet assembly according to claim 13, wherein the conical annular support and the other conical annular support are provided with flattened regions at circumferential intervals near to a respective outer flange, and respective axial rods are attached to respective flattened regions.

15. The superconducting magnet assembly according to claim 14 wherein the flattened regions are provided with additional reinforcement.

16. The superconducting magnet assembly according to claim 1, wherein the conical annular support is configured to provide support to the main magnet assembly against an outer vacuum chamber (OVC).

17. The superconducting magnet assembly according to claim 16, wherein rod bosses are provided in the conical annular support, each including a through-hole which accommodates a support rod extending between the rod boss and a mounting point attached to an inner surface of the OVC.

18. The superconducting magnet assembly according to claim 17, further comprising a thermal radiation shield located between the superconducting magnet and the OVC, wherein the thermal radiation shield is retained and mechanically supported by the support rods.

19. The superconducting magnet assembly according to claim 18, wherein at least one shield support is mounted on a support rod, and the shield support is attached to the thermal radiation shield such that the weight of the thermal radiation shield is at least partially borne by the shield support.

20. The superconducting magnet assembly according to claim 1, further comprising another conical annular support and an opaque tube extending between radially outer extremities of the respective annular supports thereby forming a thermal radiation shield for the main magnet assembly and the shield coils.

21. A superconducting magnet assembly comprising:
a main magnet assembly including at least one annular coil arranged about an axis,
at least one shield coil, of greater diameter than the main magnet assembly, arranged about the axis, and
at least one conical annular support attached to the shield coil and to the main magnet assembly, wherein an overbinding is bonded to the radially outer surface of the shield coil, and protrudes axially beyond an axial end of the shield coil, a radially outer circumference of the material of the annular support being attached to the overbinding.

22. The superconducting magnet assembly according to claim 21, wherein a radially outer flange is provided in the material of the annular support, the annular support being attached to the shield coil by the radially outer flange.

23. The superconducting magnet assembly according to claim 22, wherein the radially outer flange extends axially and is attached to the overbinding.

* * * * *